(12) United States Patent
Blazer

(10) Patent No.: US 12,339,322 B2
(45) Date of Patent: Jun. 24, 2025

(54) THREE PHASE FREQUENCY SENSOR WITH OPEN/SHORT IMMUNITY

(71) Applicant: Hamilton Sundstrand Corporation, Charlotte, NC (US)

(72) Inventor: Christopher Blazer, Machesney Park, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 217 days.

(21) Appl. No.: 18/183,664

(22) Filed: Mar. 14, 2023

(65) Prior Publication Data

US 2024/0310442 A1    Sep. 19, 2024

(51) Int. Cl.
*G01R 31/34* (2020.01)
*G01R 31/00* (2006.01)

(52) U.S. Cl.
CPC ......... *G01R 31/343* (2013.01); *G01R 31/008* (2013.01)

(58) Field of Classification Search
CPC .. G01R 31/343; G01R 31/008; G01R 25/005; G01R 23/02
USPC .................................................. 324/765.01
See application file for complete search history.

(56) References Cited

U.S. PATENT DOCUMENTS

| | | | |
|---|---|---|---|
| 4,044,296 A | 8/1977 | Dhyanchand et al. | |
| 4,451,770 A * | 5/1984 | Boettner | H02P 23/06 318/727 |
| 4,482,852 A * | 11/1984 | Muskovac | H02M 7/525 318/729 |
| 7,233,129 B2 * | 6/2007 | Erdman | H02P 9/02 322/17 |
| 7,777,436 B2 | 8/2010 | Brown et al. | |
| 7,859,230 B2 | 12/2010 | Rozman et al. | |
| 7,944,187 B2 | 5/2011 | Dooley | |
| 10,338,119 B2 * | 7/2019 | Frampton | G01R 31/343 |
| 2004/0263147 A1 * | 12/2004 | Piesinger | G01R 29/18 324/86 |

(Continued)

FOREIGN PATENT DOCUMENTS

| | | |
|---|---|---|
| EP | 3285080 A1 | 2/2018 |
| KR | 101462439 B1 | 11/2014 |

OTHER PUBLICATIONS

European Search Report for Application No. 24163481.5, mailed Aug. 13, 2024, 7 pages.

(Continued)

*Primary Examiner* — Christopher P McAndrew
(74) *Attorney, Agent, or Firm* — CANTOR COLBURN LLP

(57) ABSTRACT

A frequency sensor system for a three-phase generator includes a first stage that receives all three phases of the three-phase generator and generates three scaled difference signals from them. The system also includes a summing and filtering stage, the summing and filtering stage combining the three scaled difference signals to form a single combined signal and the filtering the single combined signal with an active filter to produce a filtered combined signal. The system also includes a gain stage that amplifies the filtered combined signal to form an amplified filtered combined signal and a comparator that converts the amplified filtered combined signal into a digital output having a frequency that matches a frequency of the amplified filtered combined signal.

12 Claims, 6 Drawing Sheets

(56) References Cited

U.S. PATENT DOCUMENTS

2014/0340111 A1* 11/2014 Mercadal ............. G01R 31/008
  324/764.01
2018/0052193 A1* 2/2018 Frampton ................. H02J 3/38

OTHER PUBLICATIONS

Machine Translation of KR101462439B1, Published Nov. 17, 2014, 17 pages.

* cited by examiner

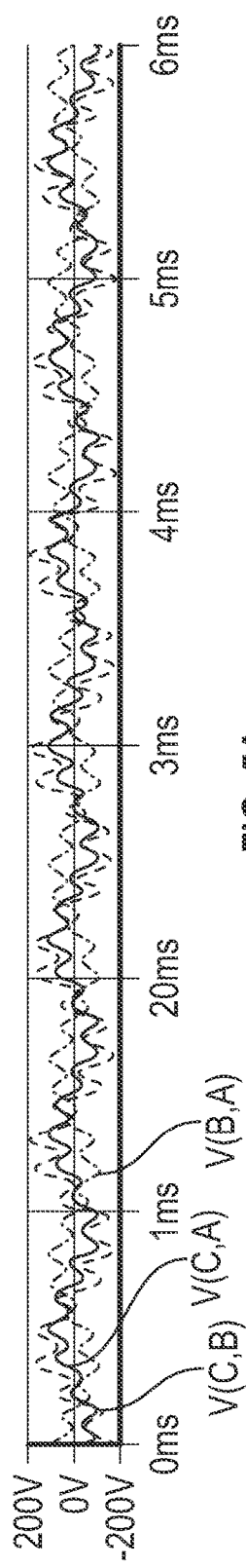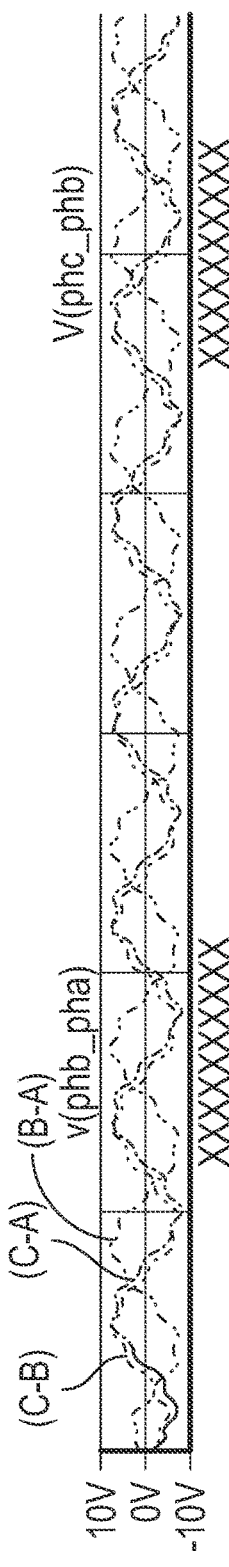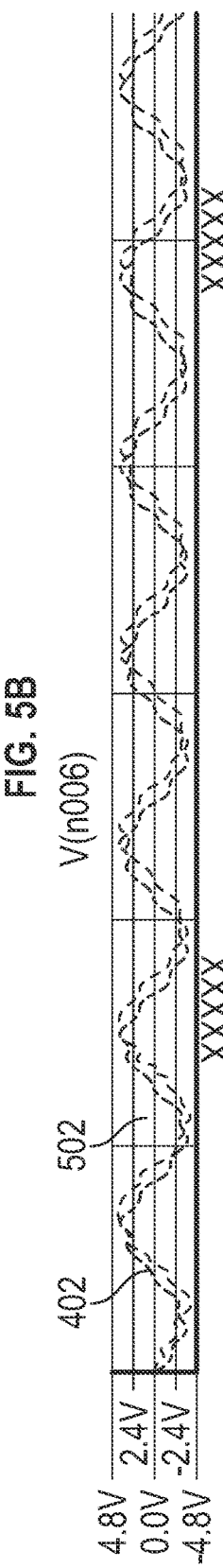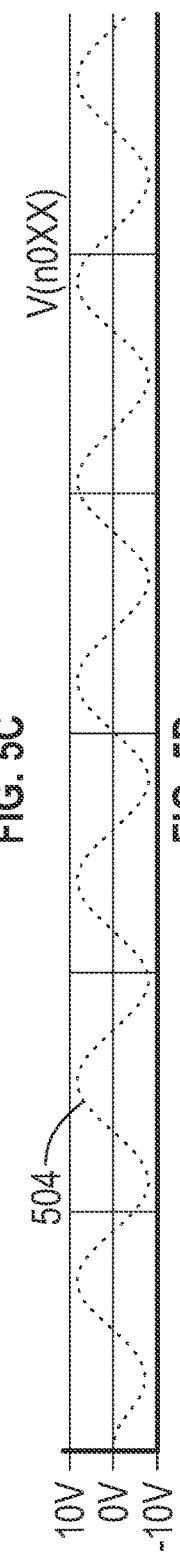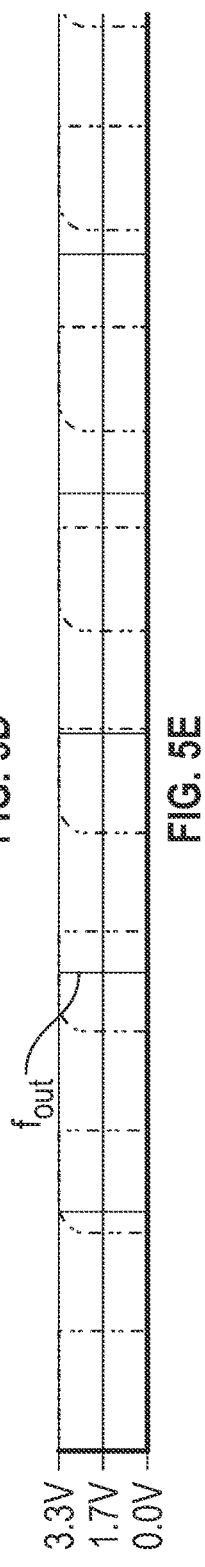
FIG. 5A
FIG. 5B
FIG. 5C
FIG. 5D
FIG. 5E

THREE PHASE FREQUENCY SENSOR WITH OPEN/SHORT IMMUNITY

BACKGROUND

The present invention generally relates to health monitoring and fault detection and, more specifically, to online health monitoring and fault detection for high voltage DC distribution networks.

Aircraft require electrical power to operate many parts of the aircraft system, including on-board flight control systems, lighting, air conditioning etc. The current and future generations of aircraft use more and more electrical control in place of convention hydraulic, pneumatic etc. control. Such more electric aircraft (MEA) have advantages in terms of the size and weight of the controls and power systems as well as in terms of maintenance and reliability.

Regardless of aircraft type, it is common for 3-phase electricity to be generated by a generator. These generators can, in some instance, be permanent magnet generators (PMGs).

While not common, in some cases one of the short phases can be open/shorted and the PMG can still operate and need to be controlled to a desired frequency. During such operation, the frequency of the PMG may be hard to sense and, thus, control/monitoring can be difficult.

BRIEF DESCRIPTION

Embodiments of the present invention are directed to A frequency sensor system for a three-phase generator. The system includes a first stage that receives all three phases of the three-phase generator and generates three scaled difference signals from them and a summing and filtering stage. The summing and filtering stage combines the three scaled difference signals to form a single combined signal and the filtering the single combined signal with an active filter to produce a filtered combined signal. The system also includes a gain stage that amplifies the filtered combined signal to form an amplified filtered combined signal and a comparator that converts the amplified filtered combined signal into a digital output having a frequency that matches a frequency of the amplified filtered combined signal.

In any prior system, the three phases can include phase A, phase B, and phase C.

In any prior system, the first stage can include a first amplifier, a second amplifier and a third amplifier. In one embodiment, the first amplifier has phases A and B connected to its inputs, the second amplifier has phases B and C connected to its inputs and the first amplifier has phases C and A connected to its inputs.

In any prior system, phase A can be connected to an inverting input of the first amplifier and phase B can be connected to a non-inverting input of the first amplifier.

In any prior system, phase B can be connected to an inverting input of the second amplifier and phase C can be connected to a non-inverting input of the second amplifier.

In any prior system, phase A can be connected to an inverting input of the third amplifier and phase C can be connected to a non-inverting input of the third amplifier.

In any prior system, a gain of the first amplifier can be greater than a gain of the second amplifier.

In any prior system, the summing and filtering stage can define a summing node and the outputs of the first, second and third amplifiers can all be connected to the summing node.

In any prior system, the output of the first amplifier can be connected to the summing node through a first summing resistor.

In any prior system, the output of the second amplifier can be connected to the summing node through a second summing resistor.

In any prior system, the output of the third amplifier can be connected to the summing node through a third summing resistor.

In any prior system, the summing node can be connected to an active low pass filter.

In any prior system, the active low pass filter can be a Sallen-Key low-pass filter.

In one embodiment, a method of determining frequency of a three-phase generator. The method includes: receiving all three phase of the three-phase generator and generating three scaled difference signals with three amplifiers from them; a summing and filtering stage, the summing and filtering stage combining the three scaled difference signals to form a single combined signal and the filtering the single combined signal with an active filter to produce a filtered combined signal; a gain stage that amplifies the filtered combined signal to form an amplified filtered combined signal; and a comparator that converts the amplified filtered combined signal into a digital output having a frequency that matches a frequency of the amplified filtered combined signal.

In any prior method, the three phases can include phase A, phase B, and phase C, the first stage can include a first amplifier, a second amplifier and a third amplifier; the first amplifier can have phases A and B connected to its inputs; the second amplifier can have phases B and C connected to its inputs; and the first amplifier can have phases C and A connected to its inputs.

In any prior method, phase A can be connected to an inverting input of the first amplifier and phase B can be connected to a non-inverting input of the first amplifier.

In any prior method, phase B can be connected to an inverting input of the second amplifier and phase C can be connected to a non-inverting input of the second amplifier.

In any prior method, phase A can be connected to an inverting input of the third amplifier and phase C can be connected to a non-inverting input of the third amplifier.

In any prior method, the method can also include setting a gain of the first amplifier to a level greater than a gain of the second amplifier.

In any prior method, the summing and filtering includes defining a summing node and the connecting outputs of the first, second and third amplifiers to the summing node.

In any prior method, the method can also include connecting the output of the first amplifier to the summing node through a first summing resistor.

In any prior method, the method can also include connecting the output of the second amplifier to the summing node through a second summing resistor.

In any prior method, the method can also include connecting the output of the third amplifier to the summing node through a third summing resistor.

In any prior method, the method can also include connecting the summing node to an active low pass filter.

In any prior method, the active low pass filter can be a Sallen-Key low-pass filter.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 5A-5E show waveforms at differing locations in the system during operation with a short/open phase.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

A detailed description of one or more embodiments of the disclosed apparatus and method are presented herein by way of exemplification and not limitation with reference to the Figures.

As noted above, even when one phase of the PMG is shorted/open, the frequency of the PMG still needs to be monitored. However, the frequency of the PMG may be hard to sense in such cases. In particular, there can be increased ripple present on the summed measurement when a phase fails open/short. If the introduced ripple is not handled properly, it can cause double clocking which will cause the resulting frequency measurement to be incorrect.

Disclosed herein is a generator frequency sensor that can operate with an open/short phase. While the following disclosure is described in the connects of a PMG generator, it shall be understood that the frequency sensor disclosed herein can be applied to any generator that outputs polyphase power.

Figure 1:
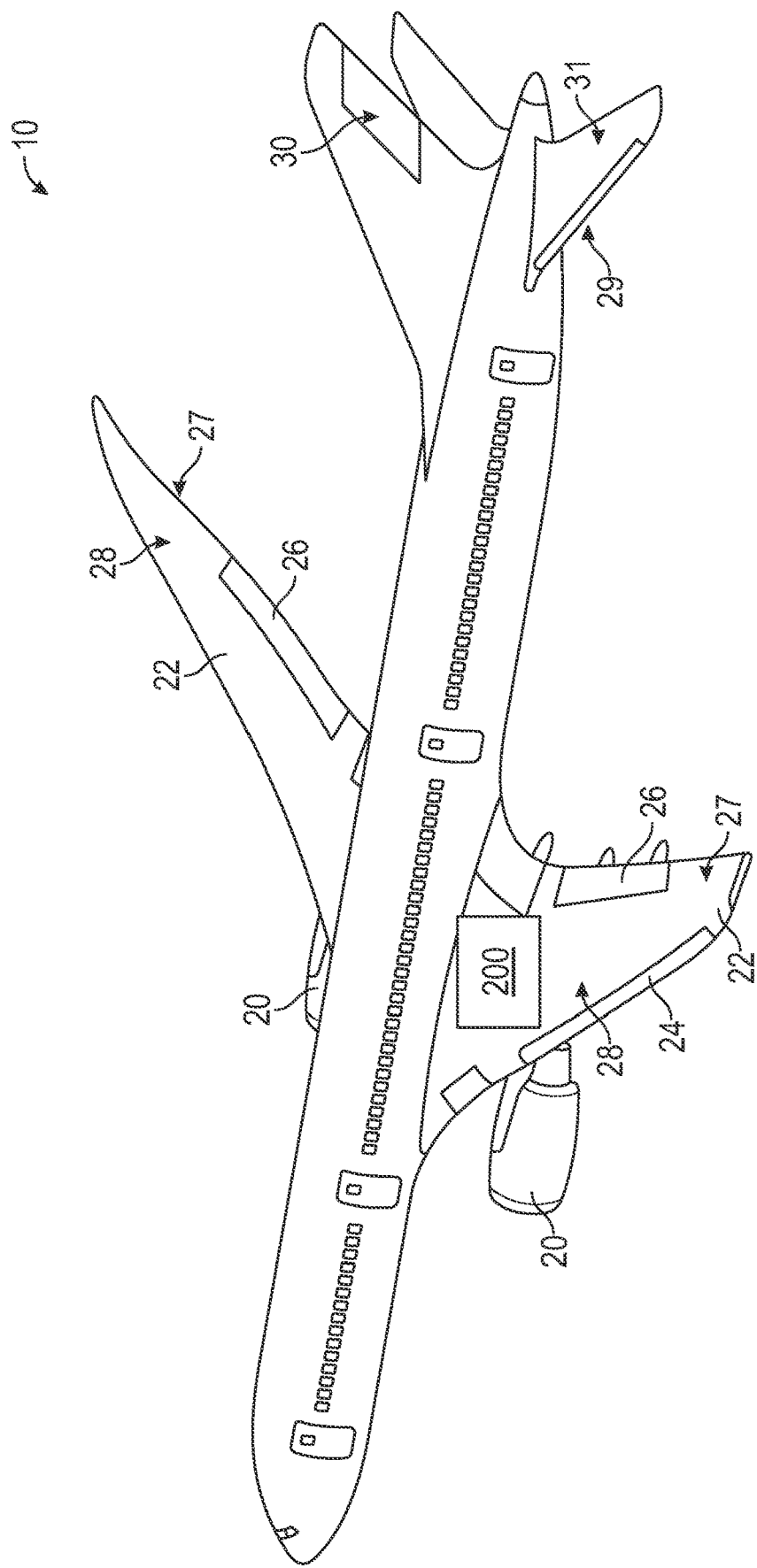
FIG. 1 is a perspective view of an aircraft that may incorporate embodiments of the present disclosure.

FIG. 1 illustrates an example of a commercial aircraft 10 having aircraft engines 20 on which embodiments can be implemented. The aircraft 10 includes two wings 22 that each include one or more slats 24 and one or more flaps 26. The aircraft further includes ailerons 27, spoilers 28, horizontal stabilizer trim tabs 29, rudder 30 and horizontal stabilizer 31. The term "control surface" used herein includes but is not limited to either a slat or a flap or any of the above described.

The aircraft 10 also includes one or more AC generators 200 (described in greater detail in FIG. 2) which include sensors for measuring the frequency of the generators.

Figure 2:
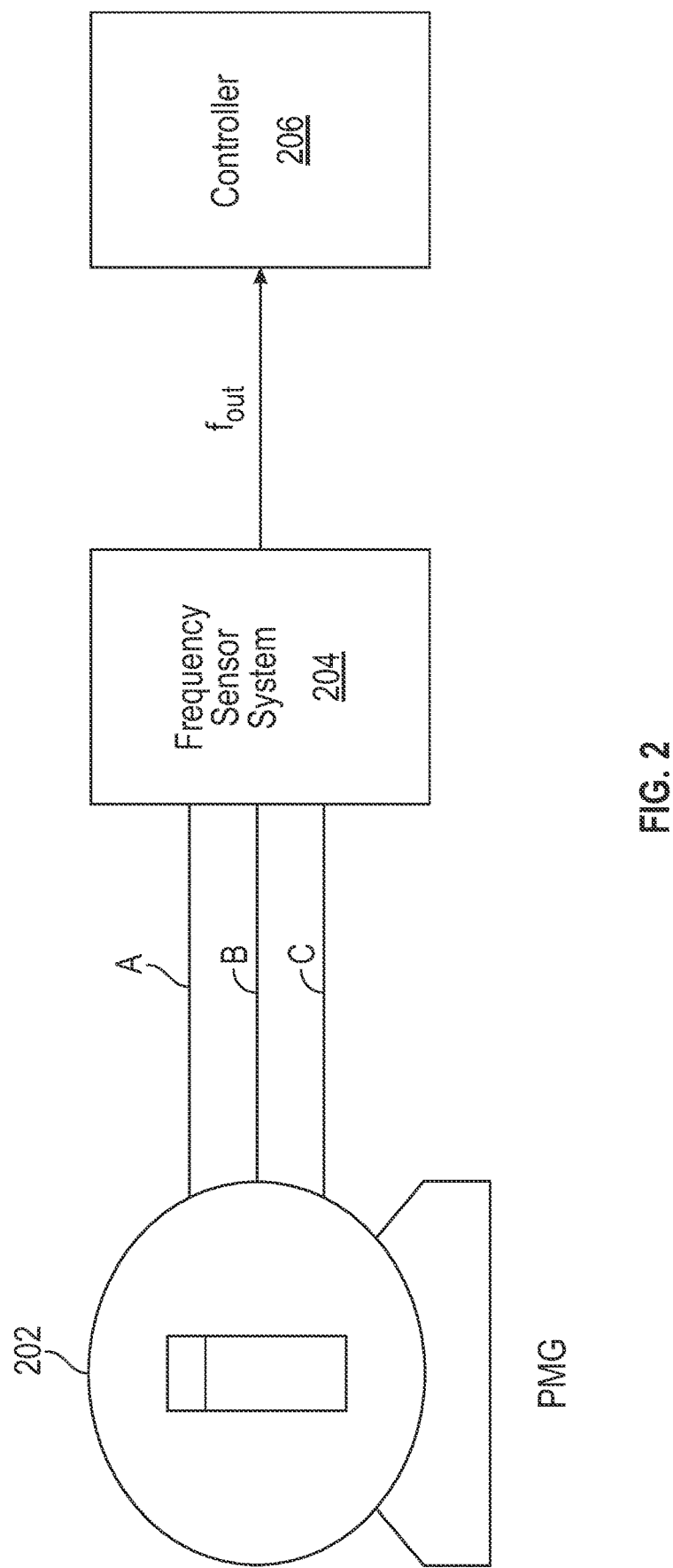
FIG. 2 depicts an example embodiment of a system according to one embodiment.

FIG. 2 shows an example a system according to one embodiment. The system 200 includes a generator 202 connected to a frequency sensor 204 according to one embodiment. The generator 202 can be any type of polyphase generator. As illustrated the generator 202 is three-phase PMG generator but other types of generators could be used. As illustrated, the generator 202 has three-phases (A, B, C). The teachings herein can apply to a generator that has at least 2 or more phases as will be understood by the skilled artisan based on this disclosure.

The system in FIG. 2 includes a frequency sensor system 204. The output of the frequency sensor system 204 ($f_{out}$) can be used by a controller 206 to control, for example, an AC to AC converter (not shown) used to produce a constant frequency output that is based on $f_{out}$.

The controller 206 or any of the hardware (e.g., frequency sensor 204) referenced in the system 300 can be implemented by executable instructions and/or circuitry such as a processing circuit and memory. The processing circuit can be embodied in any type of central processing unit (CPU), including a microprocessor, a digital signal processor (DSP), a microcontroller, an application specific integrated circuit (ASIC), a field programmable gate array (FPGA), or the like. Also, in embodiments, the memory may include random access memory (RAM), read only memory (ROM), or other electronic, optical, magnetic, or any other computer readable medium onto which is stored data and algorithms as executable instructions in a non-transitory form.

Figure 3:
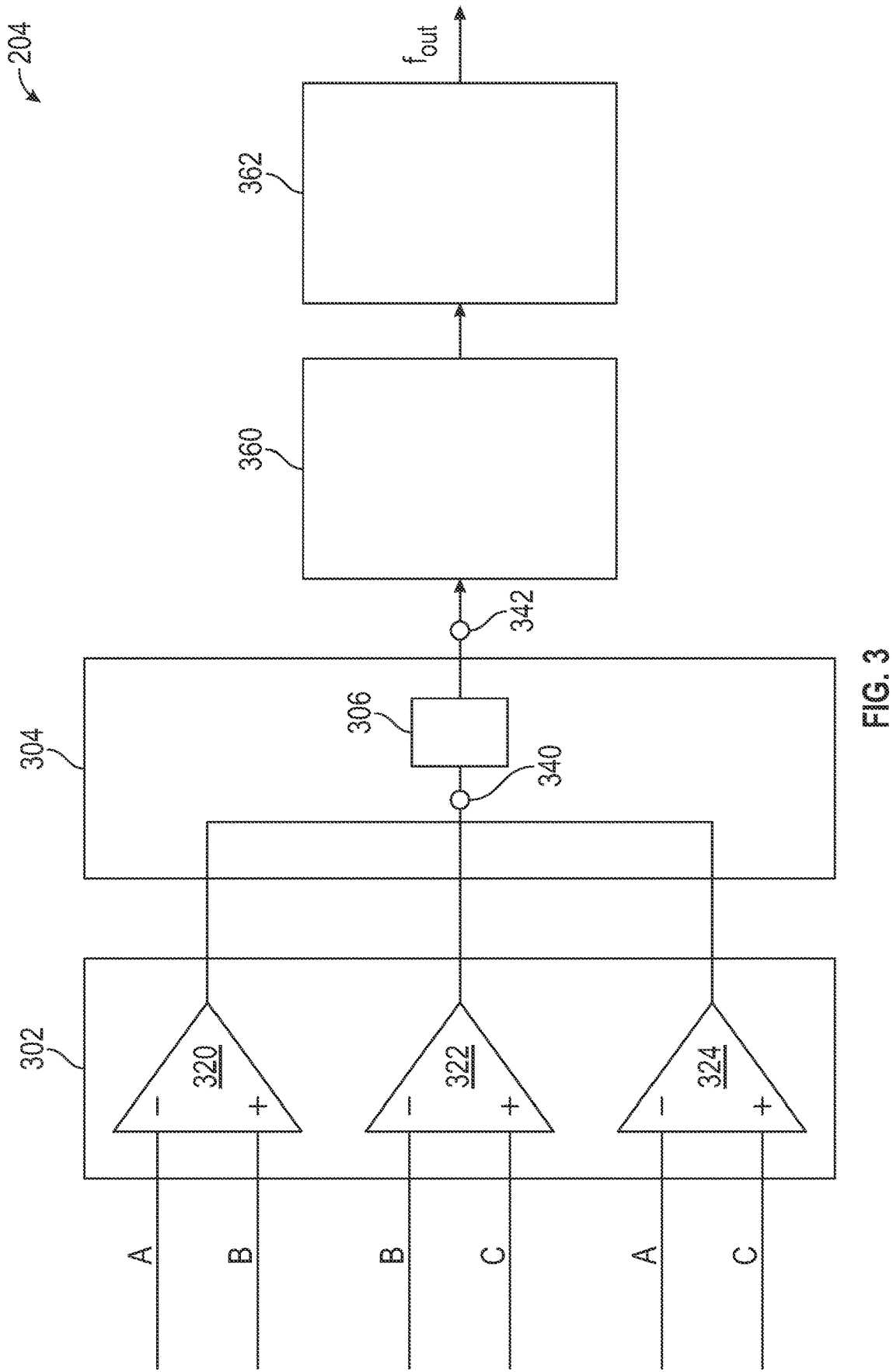
FIG. 3 shows a more detailed version of the frequency sensor system of FIG. 2.

FIG. 3 shows a more detailed version of a frequency sensor system 204 according to one embodiment. The frequency sensor 204 includes a first stage 302 that can also be referred to as scaling/low pass filter stage. The output of the first stage 302 is in the form during normal operation of three sinusoidal waves that have generally the same frequency.

The first stage 302 includes a plurality of amplifiers that amplify the difference signal between the various phases and to pass lower frequencies to filter out noise. As shown, the first stage 302 includes, in this example, three amplifiers 320, 322, 324, one for each phase A, B, C.

The amplifiers 320, 322, 324 function as differential amplifiers and create a difference in between two phases. In particular, amplifier 320 has phase B connected to its non-inverting output and phase A connected to its inverting output. Thus, it produces an output B-A. Amplifier 322 has phase C connected to its non-inverting output and phase B connected to its inverting output. Thus, it produces an output C-B. Amplifier 324 has phase C connected to its non-inverting output and phase A connected to its inverting output. Thus, it produces an output C-A. It is noted that inputs to the third amplifier 324 would logically produce output A-C given other amplifiers but its inputs are flipped to vary its output phase relative to the other two amplifiers 320, 322. If all three phases were measured in phase, the sum would always be 0V, but by inverting the Phase C to Phase A measurement (amplifier 324—shown as C-A) it ensures that the resulting sum will always be non-zero in amplitude.

Figure 4A:
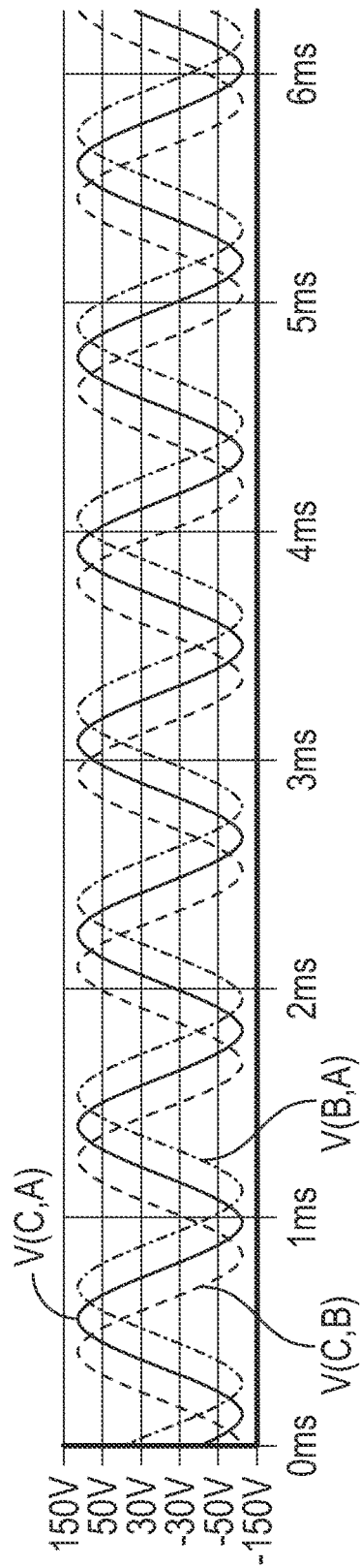
FIGS. 4A-4C show waveforms at differing locations in the system during normal operation.
Figure 4B:
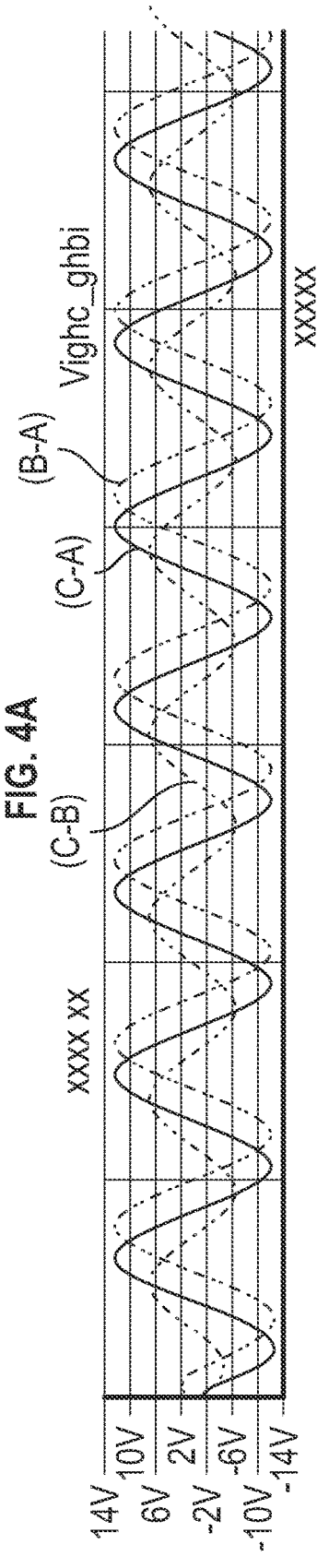

FIG. 4a shows example signals can be provided to amplifiers 320, 322, 324 during normal operation. In FIG. 4a, the notation V(B,A) denotes the relative values of phases B and phase A before they are compared by the amplifier. The outputs of these amplifiers as shown in FIG. 4b. during normal operation. As will be noted, the values are scaled down to a value bounded by the mains voltages provided to the amplifiers.

In one embodiment the amplifier 322 controlling the B-C measurement (C-B in the difference configuration shown in FIG. 2) can be configured so that it has a lower gain than the other two phases. If all three phase measurements had the same gain, then the situation where Phases A and C are shorted would result in a zero-voltage sum:

$$Sum = (B - A) + (C - B) + (C - A) \text{ and Short} = A = C;$$

$$sum = (B - \text{Short}) + (\text{Short} - B) + (\text{Short} - \text{Short});$$

$$Sum = 0;$$

By making the relative gain on Phase C-Phase B lower, the result is non-zero in this case:

$$Sum = (B - A) + x(C - B) + (C - A) \text{ and Short} = A = C;$$

$$Sum = (B - \text{Short}) + x(\text{Short} - B) + (\text{Short} - \text{Short}); \text{ and}$$

$$Sum = (B - xB) = B(1 - x)$$

Figure 4C:
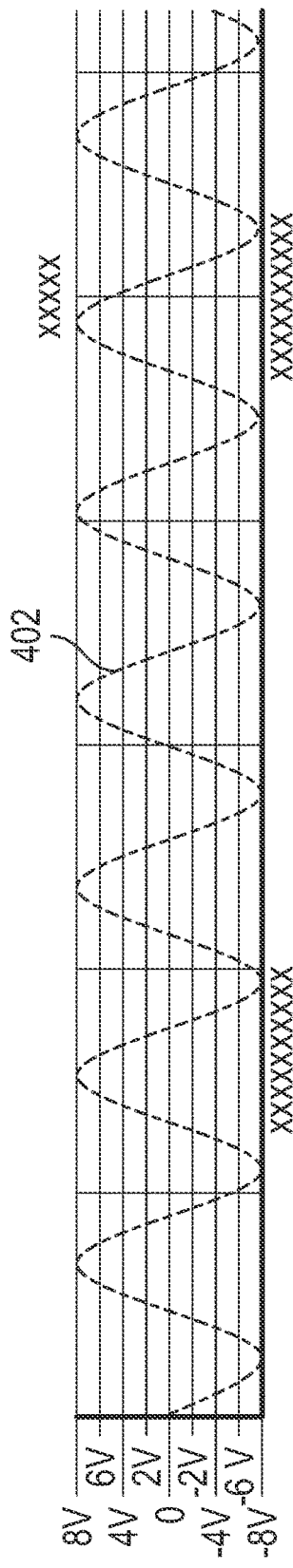

The three outputs of the first stage 302 (e.g, the signals from the amplifiers 320, 322, 324) are then combined in a second stage 304. The second stage 304 can also include an active low pass filter 306. The combined signal shown in FIG. 4c as trace 402 and is taken at node 340. Node 340 can be referred to as a summing node. The signal at node 340 is then filtered by an active filter 306 to remove noise that can be present in the case where one of the phase signals is shorted/open.

In more detail, consider the case where one or more of the phases is either open or shorted. An example of the relative input signal in such a case is shown in FIG. 5a. These relative voltage signals are very noisy in this example. The exact nature of the noise shown is by way of example only and the circuit disclosed herein can adjust to any form of noise provided by at least a short or an open phase.

As noted above, each of the signals is provided to a difference amplifier and the outputs are shown in FIG. 5b. As is clear, these signals still contain noise.

The combined signal resulting from outputs of the amplifiers 320, 322, 324 is shown by trace 402 as taken at node 340 in FIG. 5c. An active filter 306 then smooths the noisy output to produce a clean output 502 as taken at node 342.

It shall be noted that the signal at node 340 is substantially reduced in amplitude relative to the signals output by the amplifiers 320, 322, 324. The reduced signal is provided to a gain stage 360 where is it amplified as needed. In one embodiment, the gain stage 360 includes a non-inverting op-amp to boost the amplitude of the signal.

Figure 6:
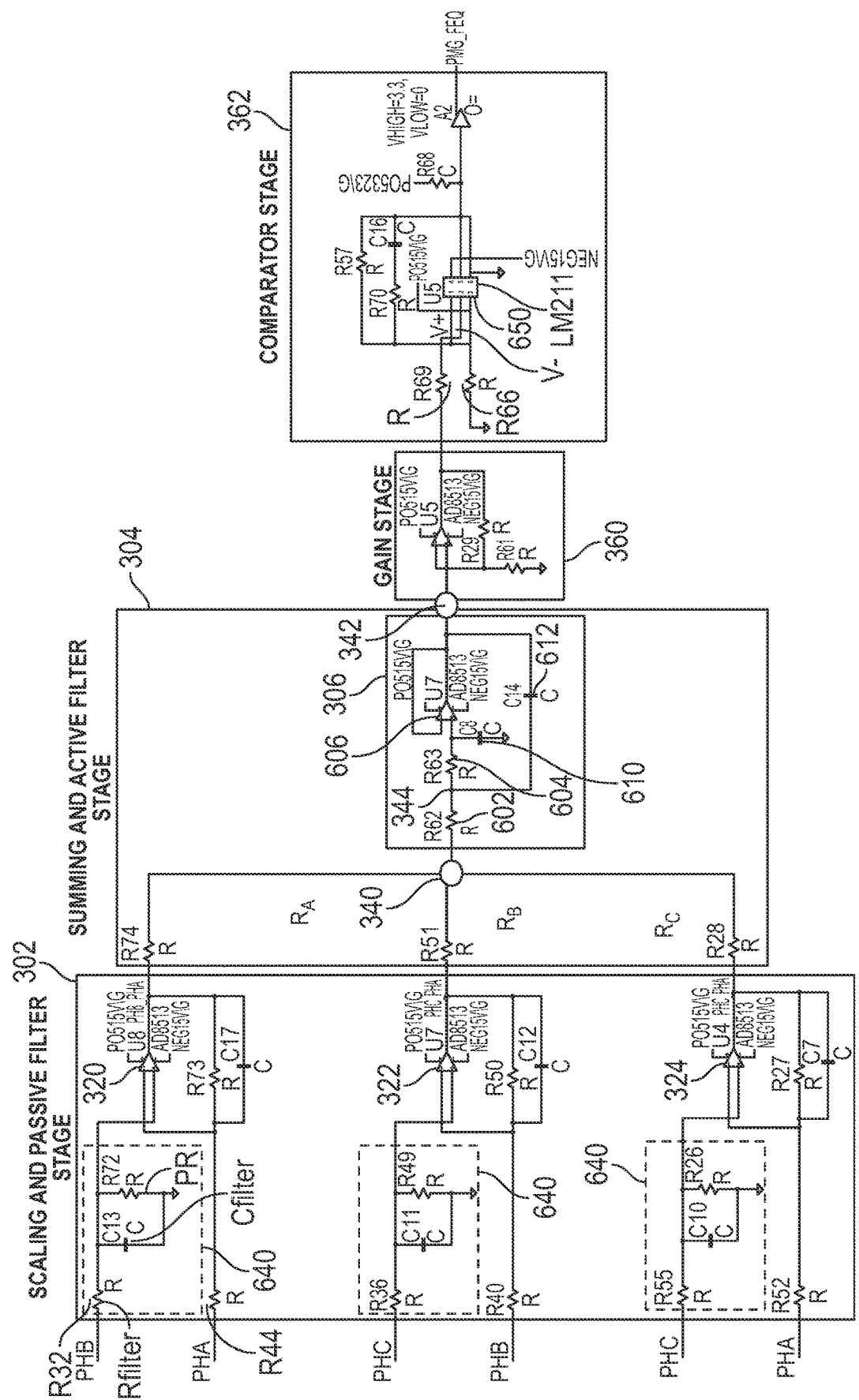
FIG. 6 shows a more detailed version of the frequency sensor system of FIG. 3.

Such an amplified signal is shown in FIG. 5d as trace 504. This sinusoidal signal can then be converted to a digital output ($f_{o\_u}$—FIG. 5e) by a comparator stage 362. This can be done, for example, by a zero-cross detector circuit as shown in FIG. 6. As indicated by signal shown in FIG. 5e, the resulting output can be a 0-3V square wave at the frequency of the PMG input.

FIG. 3 shows a generalized circuit with each of the circuit elements/stages generally shown by blocks 302, 304, 360 and 362. FIG. 6 shows one manner in which each of these blocks can be implemented.

The second stage 304 (summing and active filter stage) includes three summing resistors $R_A$, $R_B$, $R_C$ that are connected to the outputs of the respective amplifiers (scaling amplifiers) 320, 322, 324. The three summing resistors $R_A$, $R_B$, $R_C$ are also each connected to node 340. As noted above, this produces a signal 402 (FIGS. 4/5) that is sum of all of the outputs of scaling amplifiers 320, 322, 324. Node 340 is connected to an active filter 306. In one embodiment, the active filter 306 is an active low pass filter. As illustrated, the active filter 306 is a Sallen-Key low-pass filter.

The active filter 306 includes a first resistor 602 connected the between note 340 and a feedback node 344. At second resistor 604 is connected between the feedback node 344 and the non-inverting input of filter amplifier 606. In input capacitor 610 is connected between the non-inverting input of filter amplifier 606 and ground. A feedback capacitor 612 is connected between an output of the filter amplifier 606 and the feedback node 344. The output of the filter amplifier 606 is connected to the inverting input of filter amplifier 606.

It should also be noted that each phase A, B, C is first filtered by an RC filter circuit 640. That circuit can include a series RC filter (Rfilter, Cfilter). In one embodiment, a scaling resistor (PR) can be connected in parallel with the capacitor of the RC filter. The comparator stage can be implemented with an open collector emitter comparator 650.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A frequency sensor system for a three-phase generator, the system comprising:
   a first stage that receives all three phases of the three-phase generator and generates three scaled difference signals from them, wherein the three phases include phase A, phase B, and phase C, wherein the first stage includes a first amplifier with phase A connected to an inverting input of the first amplifier and phase B is connected to a non-inverting input of the first amplifier, a second amplifier with phase B connected to an inverting input of the second amplifier and phase C connected to a non-inverting input of the second amplifier and a third amplifier with phase C connected to an inverting input of the third amplifier and phase A connected to a non-inverting input of the third amplifier;
   a summing and filtering stage, the summing and filtering stage combining the three scaled difference signals to form a single combined signal and the filters the single combined signal with an active filter to produce a filtered combined signal;
   a gain stage that amplifies the filtered combined signal to form an amplified filtered combined signal; and
   a comparator that converts the amplified filtered combined signal into a digital output having a frequency that matches a frequency of the amplified filtered combined signal.

2. The system of claim 1, wherein a gain of the first amplifier is greater than a gain of the second amplifier.

3. The system of claim 1, wherein the summing and filtering stage defines a summing node and the outputs of the first, second and third amplifiers are all connected to the summing node.

4. The system of claim 3, wherein:
   the output of the first amplifier is connected to the summing node through a first summing resistor;
   the output of the second amplifier is connected to the summing node through a second summing resistor; and
   the output of the third amplifier is connected to the summing node through a third summing resistor.

5. The system of claim 3, wherein the summing node is connected to an active low pass filter.

6. The system of claim 5, wherein the active low pass filter is a Sallen-Key low-pass filter.

7. A method of determining frequency of a three-phase generator, the method comprising:
   receiving all three phases of the three-phase generator and generating three scaled difference signals with first, second and third amplifiers from the three scaled difference signals, the three phases including phase A, phase B, and phase C;
   combining and summing with a summing and filtering stage the three scaled difference signals to form a single combined signal and the filtering the single combined signal with an active filter to produce a filtered combined signal;
   amplifying the filtered combined signal with a gain stage to form an amplified filtered combined signal; and
   converting the amplified filtered combined signal with a comparator into a digital output having a frequency that matches a frequency of the amplified filtered combined signal;
   wherein:
   phase A is connected to an inverting input of the first amplifier and phase B is connected to a non-inverting input of the first amplifier;
   phase B is connected to an inverting input of the second amplifier and phase C is connected to a non-inverting input of the second amplifier; and
   phase A is connected to an inverting input of the third amplifier and phase C is connected to a non-inverting input of the third amplifier.

8. The system of method 7, further comprising setting a gain of the first amplifier to a level greater than a gain of the second amplifier.

9. The system of method 7, wherein the summing and filtering includes defining a summing node and the connecting outputs of the first, second and third amplifiers to the summing node.

10. The method of claim 9, comprising:
    connecting the output of the first amplifier to the summing node through a first summing resistor;
    connecting the output of the second amplifier to the summing node through a second summing resistor; and
    connecting the output of the third amplifier to the summing node through a third summing resistor.

11. The method of claim 9, connecting the summing node to an active low pass filter.

12. The method of claim 11, wherein the active low pass filter is a Sallen-Key low-pass filter.

* * * * *